United States Patent [19]

Kitaoka et al.

[11] Patent Number: 5,377,009
[45] Date of Patent: Dec. 27, 1994

[54] ALIGNMENT METHOD

[75] Inventors: Atsushi Kitaoka, Ichikawa; Kenji Saitoh, Yokohama, both of Japan

[73] Assignee: Canon Kabushiki Kaisha, Tokyo, Japan

[21] Appl. No.: 819,052

[22] Filed: Jan. 10, 1992

[30] Foreign Application Priority Data

Jan. 11, 1991 [JP] Japan .................................. 013715
Jan. 9, 1992 [JP] Japan .................................. 020514

[51] Int. Cl.$^5$ ...................... G01B 11/00; G03B 27/42
[52] U.S. Cl. ........................................ 356/401; 355/53
[58] Field of Search ............................ 356/399–401, 356/356; 250/548; 355/53

[56] References Cited

U.S. PATENT DOCUMENTS

| | | | |
|---|---|---|---|
| 4,606,643 | 8/1986 | Tam .................................... | 356/401 |
| 4,808,002 | 2/1989 | Tojo et al. ......................... | 356/401 |
| 4,815,854 | 3/1989 | Tanaka et al. .................... | 356/356 |
| 4,948,983 | 8/1990 | Maruyama et al. ............... | 250/548 |

FOREIGN PATENT DOCUMENTS

| | | |
|---|---|---|
| 0065115 | 11/1982 | European Pat. Off. . |
| 0336537 | 10/1989 | European Pat. Off. . |
| 0341743 | 11/1989 | European Pat. Off. . |
| 0358513 | 3/1990 | European Pat. Off. . |

OTHER PUBLICATIONS

Patent Abstracts of Japan, vol. 10, No. 65, an English Abstract published Mar. 14, 1986 of Japanese Patent No. 60-216,548.
"Optical Alignment System for Submicron X-Ray Lithography" Journal of Vacuum Science and Technology, vol. 16, No. 6, Nov. 1979, New York US, pp. 1954-1958, B. Fay et al.

Primary Examiner—Richard A. Rosenberger
Assistant Examiner—K. P. Hantis
Attorney, Agent, or Firm—Fitzpatrick, Cella, Harper & Scinto

[57] ABSTRACT

A method of aligning a mask and a wafer includes a step for providing the mask with first and second patterns each having an optical power and providing the wafer with first and second marks each having an optical power. A radiation beam irradiating the first pattern and the first mark produces a first beam, displaceable at a first magnification with a positional deviation of the wafer with respect to the mask, and irradiating the second pattern and the second mark produces a second beam, displaceable at a second magnification, larger than the first magnification, with a positional deviation of the wafer with respect to the mask. A first detecting step projects a radiation beam to the first mark and the first pattern to produce the first beam and detects a positional deviation of the wafer with respect to the mask based on the first beam. A first aligning step roughly aligns the wafer with the mask in accordance with the first detecting step. A second detecting step projects a radiation beam to the second pattern and the second mark to produce the second beam, and detects the residual positional deviation of the wafer and the mask based on the second beam. A second aligning step precisely aligns the mask and the wafer based on the second detecting step.

26 Claims, 11 Drawing Sheets

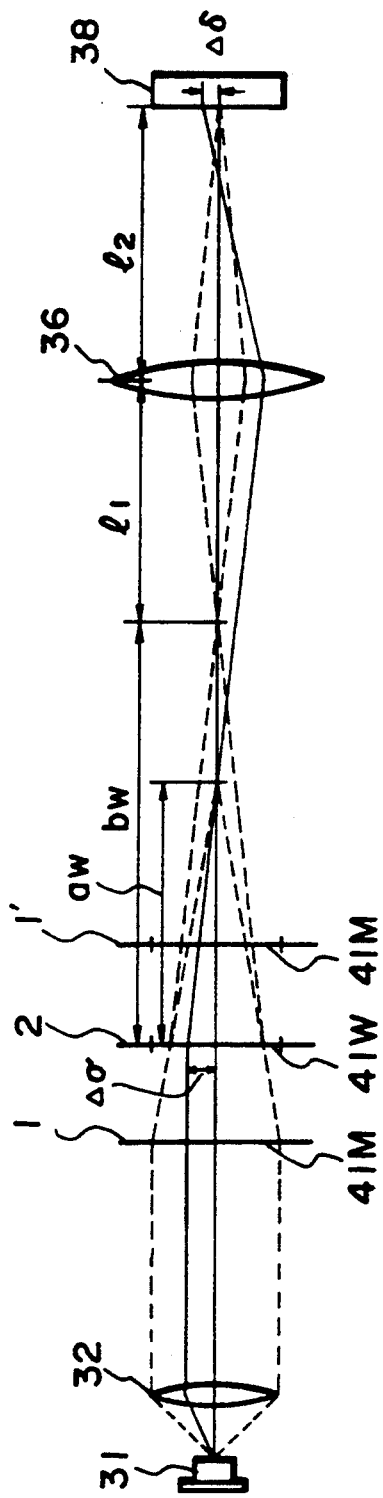
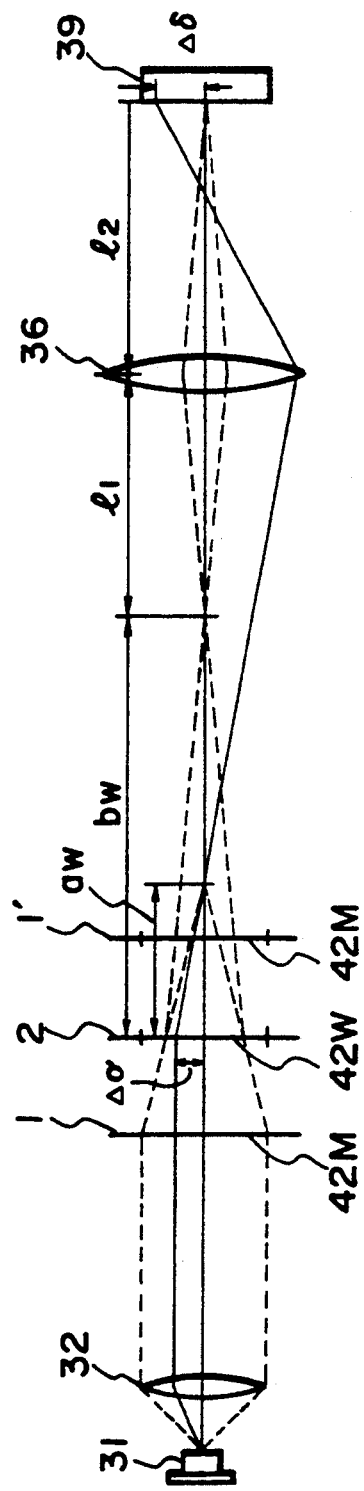
FIG. 3A
FIG. 3B

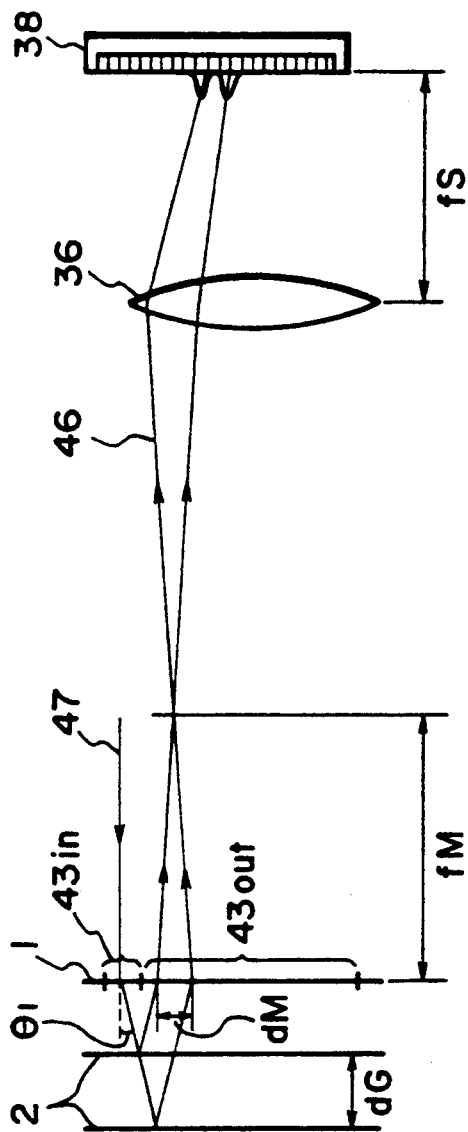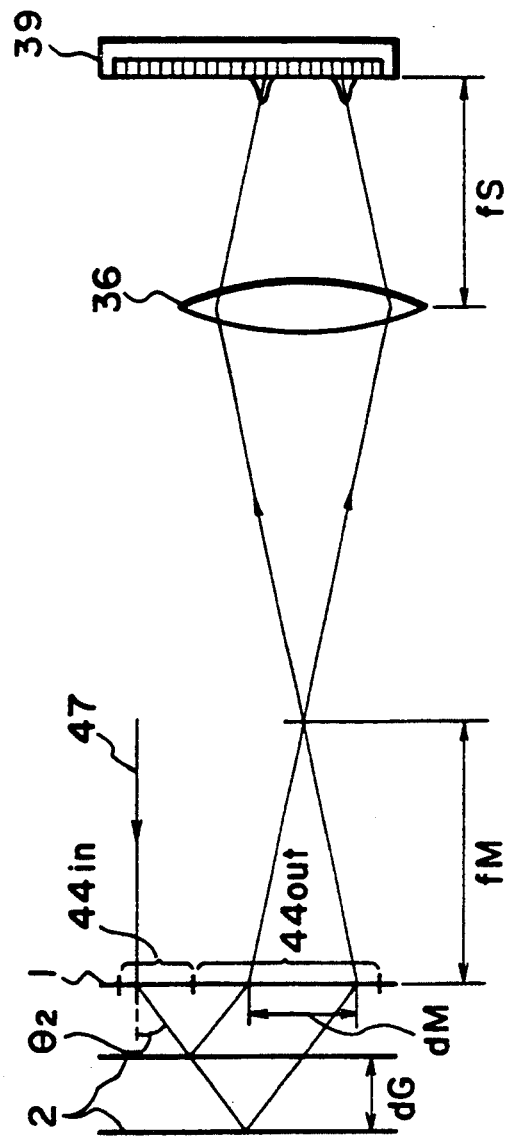
FIG. 5A
FIG. 5B

ALIGNMENT METHOD

FIELD OF THE INVENTION AND RELATED ART

This invention relates to an alignment method and, more particularly, to a method for aligning the mask and a wafer or for adjusting a gap between a mask and a wafer.

With the increasing degree of integration of a semiconductor device, improvements in lithography for printing a very fine circuit pattern on a wafer have been desired. An attempt to satisfy such a need is a proximity type X-ray aligner (alignment and exposure apparatus). The X-ray aligner can print a circuit pattern of the submicron order, but precise alignment of a mask and a wafer as well as precise adjustment of the proximity gap between the mask and the wafer are necessary.

Many proposals have been made for such a mask-to-wafer alignment or to the gap adjustment (e.g. U.S. Pat. No. 4,948,983 or European Patent Application Publication No. 0,336,537).

In U.S. Pat. No. 4,948,983, a linear zone plate is formed on a mask by which a linear light beam is projected onto a wafer. A diffraction grating mark is formed on the wafer and this mark is scanned with the linear light beam while, on the other hand, the intensity of diffraction light produced by the diffraction grating mark is monitored. The position of the wafer is adjusted precisely until the diffraction beam has a maximum intensity.

In European Patent Application Publication No. 0,336,537, a mask and a wafer have zone plate marks formed thereon, respectively, and any shift, upon a predetermined plane, of a light beam passing through each zone plate mark is monitored. The position of the wafer is adjusted precisely until the light beam is incident on a predetermined position on that plane. The proposed alignment method is very effective since a very small positional deviation of a wafer relative to a mask can be transformed into a large amount of shift of the light beam such that high precision alignment is attainable. However, for this very reason, it has only a limited range for detection of the positional deviation. It is therefore necessary to roughly (preparatively) adjust the position of the wafer (its zone plate mark) with respect to the mask (its zone plate mark) beforehand.

The aforementioned European patent application further proposes a gap adjusting method in which any error in the proximity gap between a mask and a wafer is detected by transforming it into a large shift of a light beam, reflected by the wafer surface and passing through a zone plate mark of the mask. However, also in this gap adjusting method, for a similar reason, it is necessary to roughly (preparatively) adjust the gap between the mask and the wafer beforehand.

The aforementioned U.S. patent suggests use of a linear zone plate for rough alignment, which is formed on a mask and which has a focal length longer than that of a zone plate for fine alignment. The rough alignment of a wafer with respect to the mask can be done in a similar way as the fine alignment. If this method is incorporated into the alignment method disclosed in the aforementioned European Patent Application, then a separate alignment system is necessary for the rough alignment purpose and thus the structure of the aligner is complicated. Similarly, if an alignment scope conventionally used in a reduction projection exposure apparatus for observation of an alignment mark of a wafer for the rough alignment is to be employed, use of such an alignment scope is necessary and thus the structure of the aligner is complicated.

There is another problem that such an alignment scope or the alignment system disclosed in the aforementioned U.S. patent is not applicable to rough (preparative) adjustment of the gap between a mask and a wafer as disclosed in the aforementioned European patent application.

SUMMARY OF THE INVENTION

It is accordingly a primary object of the present invention to provide an improved alignment method or an improved gap adjusting method, including a step of rough alignment or rough gap adjustment, which is suitably used in the mask-to-wafer alignment or in the gap adjustment of the type as disclosed in the aforementioned European patent application.

It is another object of the present invention to provide improvements to the rough-and-fine alignment method of the type as disclosed in the aforementioned U.S. patent.

In accordance with an aspect of the present invention, there is provided a method of aligning a mask and a wafer, comprising: a step for providing the mask with first and second patterns each having an optical power and providing the wafer with first and second marks each having an optical power, wherein the first pattern and the first mark are cooperable with each other to produce, in response to irradiation of a radiation beam, a first beam which is displaceable at a first magnification with a positional deviation of the wafer with respect to the mask, and wherein the second pattern and the second mark are cooperable with each other to produce, in response to irradiation of a radiation beam, a second beam which is displaceable at a second magnification, larger than the first magnification, with a positional deviation of the wafer with respect to the masks a first detecting step for projecting a radiation beam to the mask, whereby the first beam is produced through cooperation of the first pattern and the first mark, and for detecting a positional deviation of the wafer with respect to the mask on the basis of the first beam: a first aligning step for preparatively aligning the wafer with the mask in accordance with the detection by the first detecting step; a second detecting step for projecting, after the first aligning step, a radiation beam to the mask whereby the second beam is produced through cooperation of the second pattern and the second mark, and for detecting a residual positional deviation of the wafer with respect to the mask on the basis of the second beam; and a second aligning step for precisely aligning the wafer with the mask in accordance with the detection by the second detecting step.

In accordance with another aspect of the present invention, there is provided a method of adjusting a gap between a mask and a wafer disposed opposed to each other, comprising: a providing step for providing the mask with a first pair of first grating pattern and first deflection pattern having an optical power, and a second pair of second grating pattern and second deflection pattern having an optical power, wherein the first pair patterns serve so that a radiation beam is diffracted by the first grating pattern and, after the radiation beam is reflected by a surface of the wafer, it is passed through the first deflection pattern whereby a first beam is produced which first beam is displaceable at a first magnification with an error of a gap between the mask and the wafer, and wherein the second pair of patterns serve so that a radiation beam is diffracted by the second grating pattern and, after the radiation beam is reflected by the surface of the wafer, it is passed through the second deflection pattern whereby a second beam is produced which second beam is displaceable at a second magnification, larger than the first magnification, with an error in the gap between the mask and the wafer; a first detecting step for irradiating the mask with a radiation beam and for detecting an error in the gap between the mask and the wafer by using the first beam produced by the first pair patterns; a first adjusting step for adjusting the gap between the mask and the wafer in accordance with the detection at the first detecting step; a second detecting step for irradiating, after the first adjusting step, the mask with a radiation beam and for detecting an error in the gap between the mask and the wafer by using the second beam produced by the second pair of patterns; and a second adjusting step for adjusting the gap between the mask and the wafer with a higher precision.

In accordance with a further aspect of the present invention, there is provided a method of aligning a mask and a wafer, comprising: a providing step for providing the mask with a first pattern having an optical power and a second pattern having an optical power larger than that of the first pattern, and for providing the wafer with a first grating mark including first mark elements arrayed in a predetermined direction and a second grating mark including second mark elements arrayed in the predetermined direction, wherein the first grating mark serves to produce, in response to irradiation of a radiation beam converged by the first pattern of the mask, a first diffraction beam having an intensity which is changeable with a positional deviation of the wafer with respect to the mask, and wherein the second grating mark serves to produce, in response to irradiation of a radiation beam converged by the second pattern of the mask, a second diffraction beam having an intensity which is changeable, largely as compared with the first diffraction beam, with a positional deviation of the wafer with respect to the mask; a first detecting step for projecting a radiation beam to the mask opposed to the wafer with a predetermined gap, and for detecting a positional deviation of the wafer with respect to the mask by using the first beam produced by the first grating mark; a first aligning step for aligning the wafer with respect to the mask in accordance with the positional deviation detected in the first detecting step; a second detecting step for projecting, after the first aligning step, a radiation beam to the mask opposed to the wafer with the predetermined gap, and for detecting a residual positional deviation of the wafer with respect to the mask by using the second beam produced by the second grating mark; and a second aligning step for relatively finely aligning the wafer with respect to the mask in accordance with the detection by the second detecting step.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A and 3B are schematic views, respectively, showing in expanded form, the paths of light beams for the relatively coarse and fine alignment, respectively.

FIGS. 5A and 5B are schematic views, respectively, showing in expanded form, the paths of light beams for the relatively coarse and fine gap adjustment, respectively.

DESCRIPTION OF THE PREFERRED EMBODIMENTS

Figure 1:
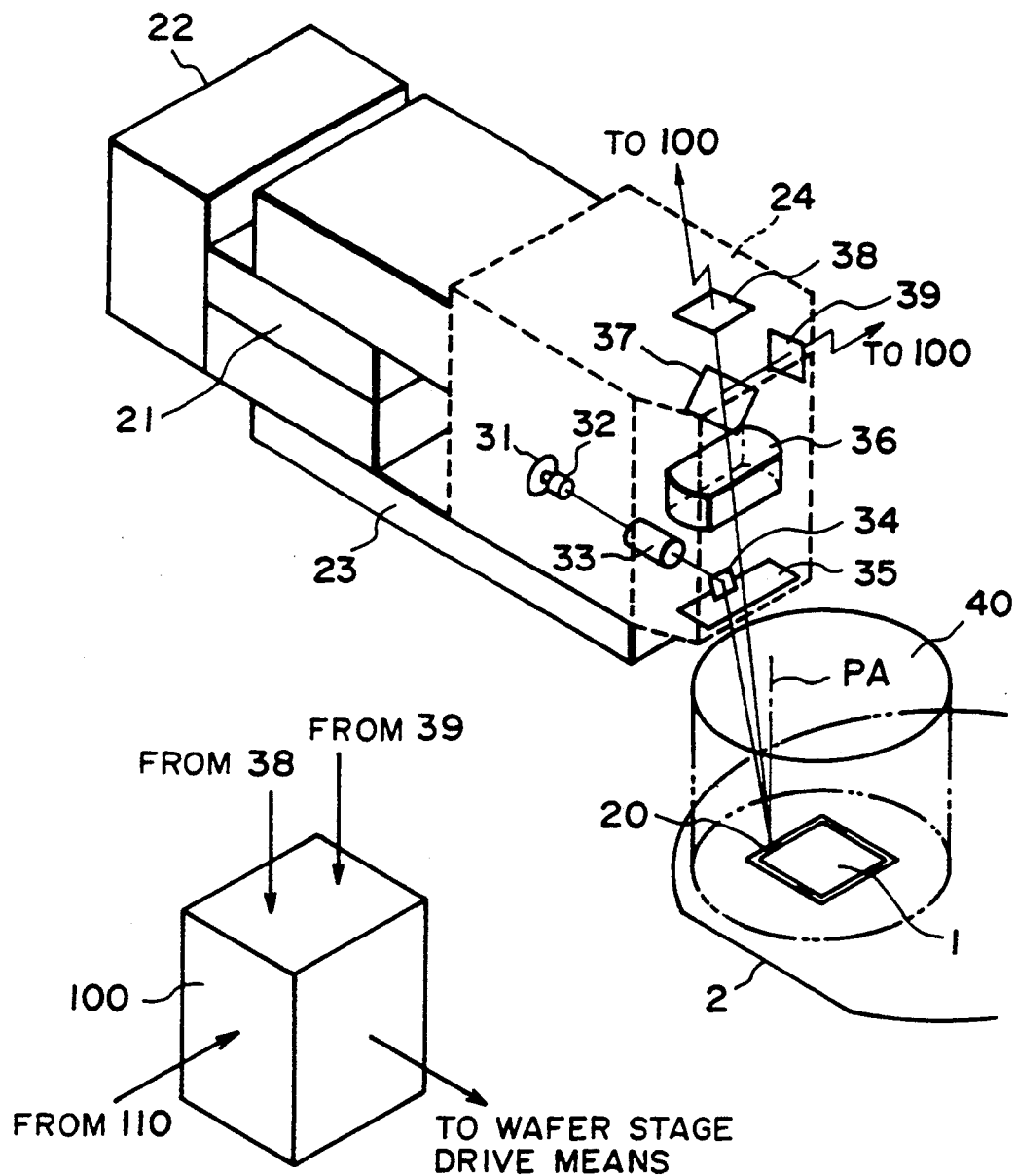
FIG. 1 is a schematic view of an X-ray exposure apparatus, for explaining an embodiment of the present invention.
Figure 2A:
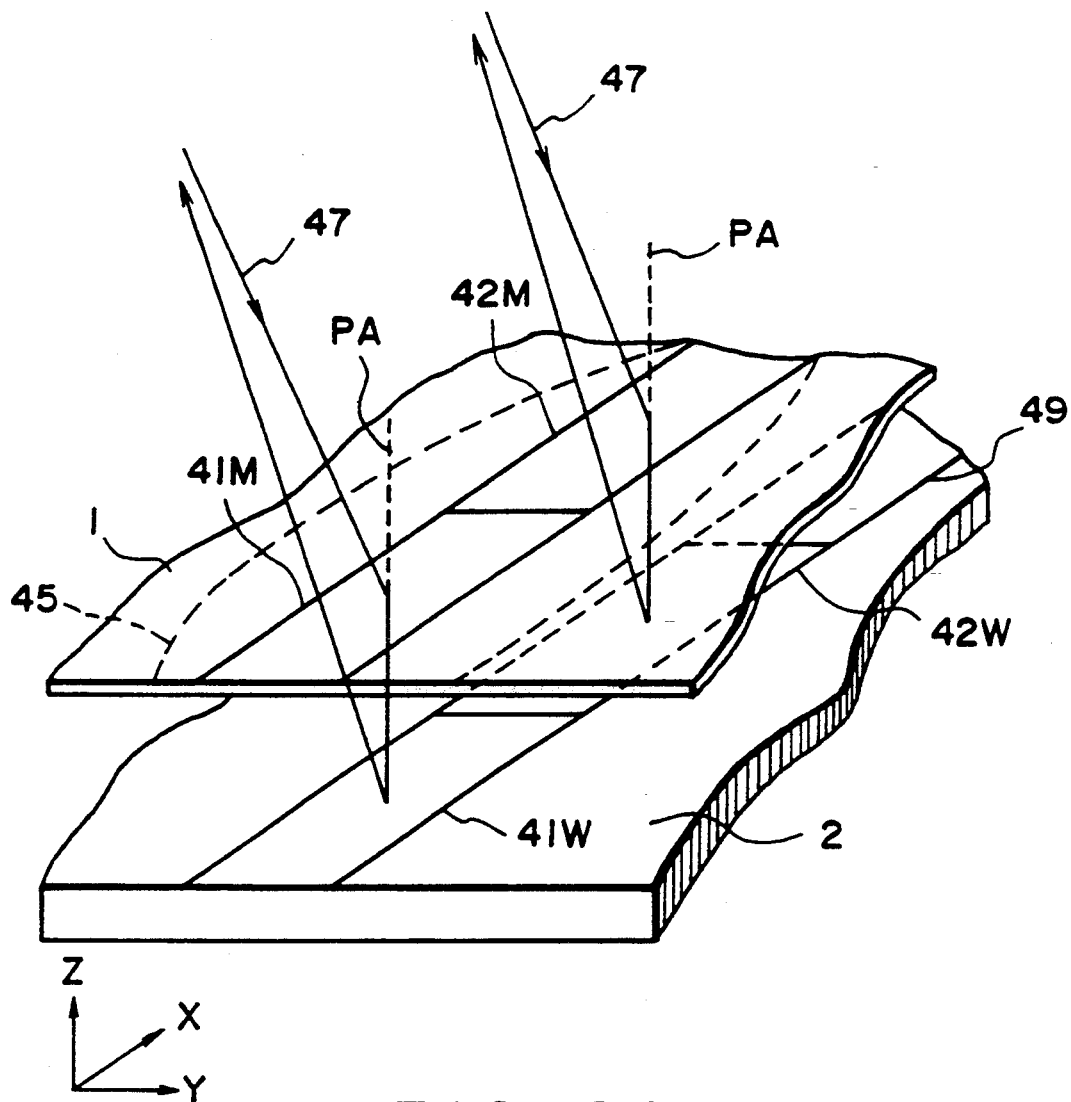
FIG. 2A is an enlarged schematic view for explaining paths of light beams, for relatively coarse alignment and relatively fine alignment, in the neighborhood of a mask.
Figure 2B:
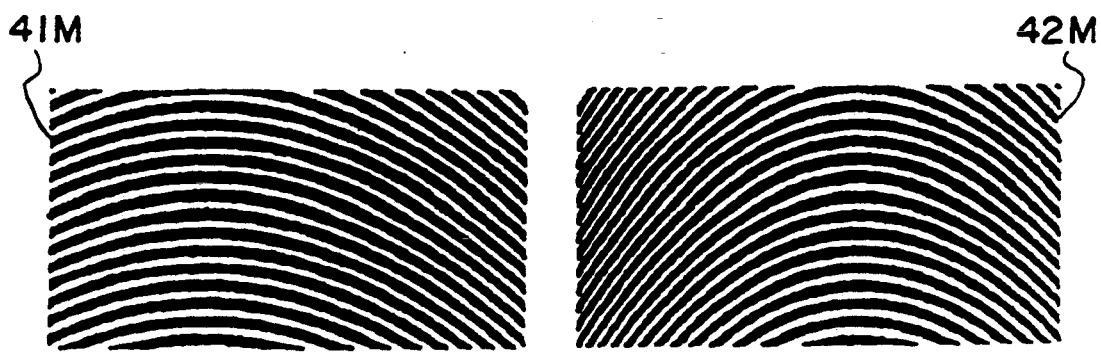
FIG. 2B is an enlarged view of mask alignment marks for the relatively coarse and fine alignment, respectively.
Figure 4A:
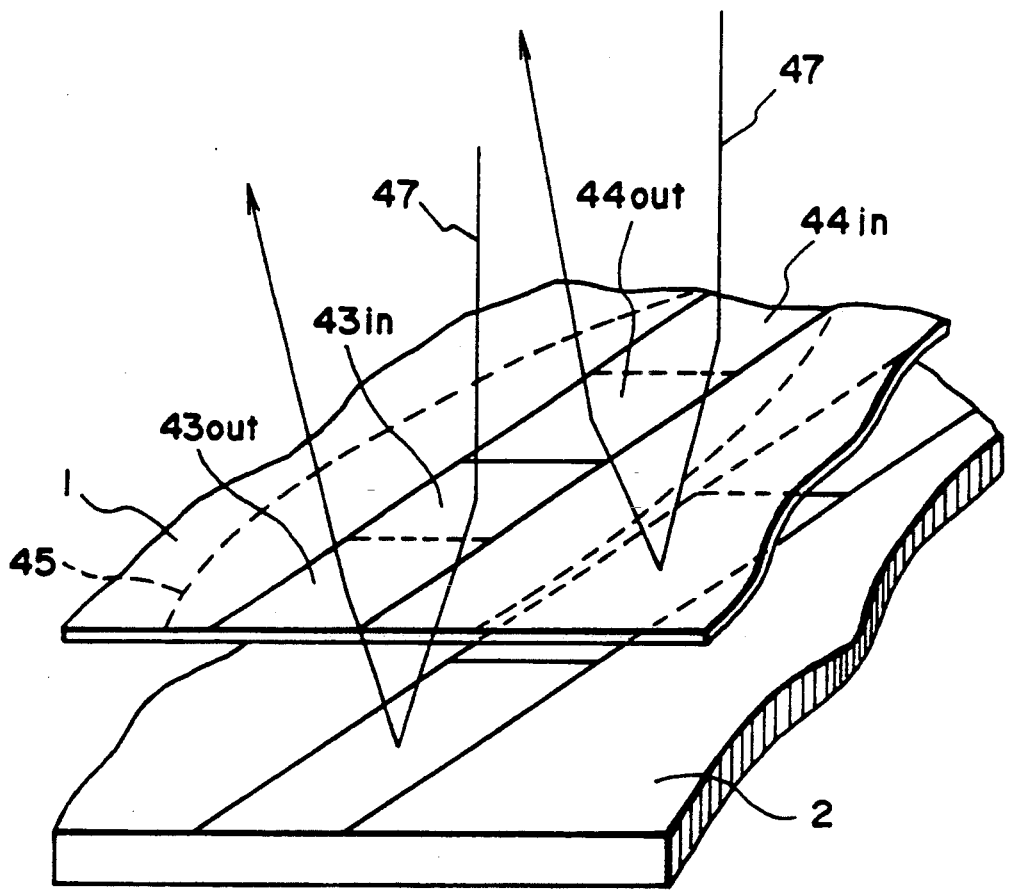
FIG. 4A is an enlarged schematic view for explaining paths of light beams, for relatively coarse gap adjustment and relatively fine gap adjustment, in the neighborhood of a mask.
Figure 4B:
FIG. 4B is an enlarged view of a mask mark for the relatively coarse gap adjustment.
Figure 4C:
FIG. 4C is an enlarged view of a mask mark for the relatively fine gap adjustment.

Referring first to FIG. 1-8, an embodiment of the present invention will be explained. The X-ray exposure apparatus shown in FIG. 1 is equipped with an alignment mechanism for aligning a mask and a wafer as well as a gap adjusting mechanism for adjusting a gap (spacing) between the mask and the wafer disposed opposed to each other.

In this embodiment, the detection of any positional deviation between the mask and the wafer for the fine (final) mask-to-wafer alignment as well as the detection of any error in the gap between the mask and the wafer for the fine (final) gap adjustment, can be made in accordance with the concept as disclosed in the aforementioned European patent application.

Now, the operation for detecting a positional deviation between a mask and a wafer in accordance with the present invention will be explained.

As shown in FIG. 1, light emanating from a light source 31 is transformed by a collimator lens 32 into parallel light. This parallel light travels via a light projecting lens 33, a half mirror 34 and a window 35, and impinges on physical optic elements 41M and 42M of a mask (first object) 1 with an inclination with respect to a normal PA to the surface of the mask 1. Each of the physical optic elements 41M and 42M comprises a grating lens, for example, which is one of Fresnel zone plates.

The physical optic element 41M serves as an alignment mark for preparative (relatively coarse) alignment, while the physical optic element 42M serves as an alignment mark for final (relatively fine) alignment. These physical optic elements 41M and 42M have different focal lengths and they provide different optical actions to the received light. Each physical optic element functions to produce diffraction light of a predetermined order or orders which emanates along the normal PA to the mask 1 surface. The produced diffraction lights from the physical optic elements 41M and 42M are incident on physical optic elements 41W and 42W of a wafer (second object) 2, respectively, which are at a predetermined distance from the physical optic elements 41M and 42M. The physical optic element 41W is an alignment mark for the preparative (relatively coarse) alignment, while the physical optic element 42W is an alignment mark for the final (relatively fine) alignment. Each of them has a light diverging function to a diffraction light inputted thereto, and it emanates through reflection the received diffraction light toward an alignment head 24. Each emanated diffraction light travels through a condensing lens and is divided into two by a half mirror 37, and the divided beams are projected and focused on detection surfaces of two detectors (sensors) 38 and 39, respectively (see FIG. 2).

The detector 38 serves as a sensor for the relatively coarse alignment, while the detector 39 serves as a sensor for the relatively fine alignment. Each detector may comprise a CCD sensor, for example. The detectors 38 and 39 each produces an output signal which corresponds to the positions of incidence of a received light on its detection surface, and, by using the output signals from these detectors, any positional deviation (quantity of lateral deviation) between the mask (first object) 1 and the wafer (second object) 2 in a translational direction can be detected.

In this embodiment, for the mask-to-wafer alignment purpose, a stage 25 (FIG. 7) on which the wafer 2 is placed is displaced to adjust the position of the wafer 2. However, a separate mask chuck moving mechanism may be provided for displacing the mask for the same purpose.

If in this arrangement the wafer 2 is laterally displaced by $\Delta\sigma$ relative to the mask 1, there occurs a change in the angle of emission of the light emanating from the mask 1 which change causes a change in the position of incidence of the light upon each of the detectors 38 and 39. If the angle of emission is small, if the mask and the wafer are laterally and mutually deviated by $\Delta\sigma$ and if the distance from the wafer 2 to the point of convergence (virtual point) of the light diffracted by the physical optic element 41M or 42M of the mask is denoted by "bw", then the displacement $\Delta\delta$ of the position of incidence of the light upon the detector 38 or 39 surface can be expressed as follows (see FIG. 3):

$$\Delta\delta = \Delta\sigma \times (bw/aw - 1) \quad (1)$$

Namely, the displacement $\Delta\delta$ is equal to the magnified quantity of positional deviation $\Delta\sigma$ of the mask and the wafer, being magnified by "(bw/aw−1)". If the coarse alignment system has aw=5.0 mm and bw=50 mm, then the lateral deviation $\Delta\sigma$ is magnified nine (9) times, and if the fine alignment system has aw=0.5 mm and bw=50 mm, then the lateral deviation $\Delta\sigma$ is magnified in ninety-nine (99) times.

Here, as seen from equation (1), the displacement $\Delta\delta$ and the positional deviation $\Delta\sigma$ are in a proportional relationship. If the detectors 38 and 39 have a resolution of 1 micron, the lateral deviation $\Delta\sigma$ between the mask and the wafer can be detected with a resolution of 0.1 micron (coarse alignment system) and 0.01 micron (fine alignment system). Also, if the width of the detecting area on the detection surface of each of the detectors 38 and 39 in the direction of the shift of the light incident thereon is set to be 990 microns, then the coarse alignment system and the fine alignment system have a detection range of ±55 microns and ±5 microns, respectively.

Each of the detectors 38 and 39 has set thereon a reference position for detection of the positional deviation which position corresponds to the "correct alignment" of the mask and the wafer. Such reference position may be determined preparatively during the mask setting on the basis of trial printings. Namely, the position of incidence of the light upon the detector as the mask and the wafer have no relative positional deviation is determined as the reference position. Then, during actual detection of a positional deviation of the mask and the wafer, the quantity of deviation of the light, from the mask, incident of the detector from the thus determined reference is measures and, on the basis of the proportional relationship expressed in equation (1), the positional deviation of the mask and the wafer is determined. The thus determined positional deviation is then corrected, whereby the mask-to-wafer alignment is accomplished.

In this embodiment, on the basis of a positional deviation $\Delta\sigma$ as obtainable through signal processing to be made in a control means 100, the wafer 2 is displaced to align the same with the mask precisely.

In this embodiment, the position of incidence of the light upon the detector 38 or 39 may be determined by detecting the gravity center position of the intensity distribution of the incident light thereupon. Such gravity center position may be a position whereat, when in the cross-section of the light a position vector of each point in the section is multiplied by the light intensity of that point and the thus obtained produces are integrated over the entire section, the integrated level has a "zero vector". In place of such a gravity center position, a peak point of the light intensity distribution may be used as the position of incidence of the light.

The light source 31 may comprise a light source having high coherency, such as a He-Ne laser or a semiconductor laser, for example; or it may comprise a light source having low coherency such as a light emitting diode (LED), a Xe lamp or a Hg lamp, for example.

Next, referring particularly to FIGS. 4A–4C, 5A and 5B, or description will be provided on the manner of measuring the gap (spacing) between a mask 1 and a wafer 2 and adjusting the gap therebetween to thereby adjust the relative position of them in the direction of the normal PA.

Light for the gap measurement is supplied from the alignment head 24, too. A pair of light beams representing an error in the gap between the mask 1 and the wafer 2 are received by the same light receiving elements (photodetectors) 38 and 39 of the alignment head 24, which are used also for the detection of the lateral deviation of the mask and the wafer. In FIGS. 4A–4C, 5A and 5B, denoted at 43in and 43out are alignment patterns (marks) for the preparative (relatively coarse) adjustment, while those denoted at 44in and 44out are alignment patterns (marks) for the final (relatively fine) adjustment. Each of the alignment patterns 43in and 44in is provided by a linear grating, while each of the alignment patterns 43out and 44out is provided by a Fresnel zone plate.

As best seen in FIGS. 5A and 5B, each light 47 emanating from the head 24 and impinging on the alignment pattern 43in (44in) of the mask 1 is diffracted at a first order, for example, and projected on the wafer 2 surface with inclination by a certain angle with respect to a normal to the wafer 2 surface. Then, the light is regularly reflected by the wafer 2 surface and it goes through the alignment pattern 43out (44out) of the mask 1. At this time, the position on the second pattern 43out (44out) of the light passing therethrough differs with the spacing between the mask 1 and the wafer 2.

The alignment patterns 43out and 44out have the same focal length fM, and they serve to direct the emanating light 46 toward the detectors 38 and 39, respectively. Additionally, each of them has a function for changing the deflection angle of the emanating light 46 in accordance with the position of incidence of the light upon the alignment pattern 43out (44out), i.e., what can be called a lens function.

As a matter of course, the alignment patterns 43out and 44out may be so set that they provide a constant deflection angle to the light.

Use of a light receiving lens 36 such as shown in FIGS. 5A and 5B provides the following advantages: That is, in the case where the light 46 emanates from the mask slightly in a divergent form so that the light beam diameter is liable to become large, the light receiving lens 36 can focus the light and thus a sharp light spot having a high energy density can be produced on The detector 38 (39); when the detector 38 (39) is disposed at the focal point position of the light receiving lens 36 having a focal length fS, the system can serve to detect only the angle of light such that, even if the light receiving lens 36 and the detectors 38 and 39 are formed in an integral structure and if there occurs a positional deviation in a direction perpendicular to the optical axis of the light receiving lens 36, such positional deviation does not result in an adverse effect. However, even in a case where the detectors 38 and 39 are not disposed at the focal point position of the light receiving lens for any reason, the precision is sufficiently practicable within a range where the effect of such positional deviation can be neglected. Therefore, the position of the detectors 38 and 39 is not necessarily limited to the focal point position of the light receiving lens 36.

In FIGS. 5A and 5B, the displacement S of the light spot on the detector surface with a unit error in gap between the mask and the wafer can be expressed as follows:

$$S = fS/fM \times dM \quad (2)$$

If the angle defined between the light emanating from the alignment pattern 43in (44in) and a normal to the wafer 2 surface is $\theta$, then the displacement S of the light spot on the detector surface to be caused by a change in the mask-to-wafer gap (reference gap), through distance dG, can be expressed as follows:

$$S = 2dG(fS/fM)\tan \theta \quad (2')$$

The present embodiment is so arranged that: the angle $\theta$ of incidence on the wafer 2 surface of the diffraction light from the alignment pattern 43in of the coarse alignment system, for the gap adjustment, is $\theta = \theta_1$; the angle $\theta$ of incidence on the wafer 2 surface of the diffraction light from the alignment pattern 44in of the fine alignment system, for the gap adjustment, is $\theta = \theta_2$; and $\theta_1 = 10°$ while $\theta_2 = 40°$. Accordingly, if fS/fM = 20, the displacement S of the light spot in the coarse alignment system is $S = 7$ dG while on the other hand $S = 33.6$ dG in the fine alignment system. If, therefore, the width of the detecting area on the detection surface of the detector 38 (39) in the direction of displacement of the light spot is 990 microns and if the detector has a resolution of 1 micron, then the coarse alignment system has a resolution of 0.14 micron and a detection range of 141 microns, while the fine alignment system has a resolution of 0.03 micron and a detection range of 29.5 microns.

In operation, the spacing between the mask and the wafer may be adjusted preparatively at a correct level (reference gap) by using a separate gap measuring means, and the gravity center position of the light quantity distribution of the light incident on the detector 38 (39) at such reference gap may be determined beforehand as a reference position. During actual detection of the mask-to-wafer gap, by using the controller 100, the deviation of the gravity center position of the light 46 from the reference position may be detected as "S" which may be subsequently substituted into equation (2') to calculate the distance dG. The distance dG may be determined as an error in gap, from the reference gap, and the gap measurement may be accomplished. Then, the wafer 2 may be moved upwardly or downwardly by a wafer driving means, to correct the error.

In accordance with the principle as described above, the absolute quantity of the spacing between he mask and the water can be measured. Accordingly, in the case where a wafer is supplied to a mask already being set and where the wafer is placed at a spacing 100 microns from the mask which is larger than a reference gap of 30 microns, for example, in the present invention, it is possible to detect the mask-to-wafer gap of 100 microns precisely and also it is possible to control the mask-to-wafer gap precisely to the desired 30 micron gap quickly, on the basis of the measurement.

Structural features and sequential operations of the present embodiment will be described below.

Light beam emanating from the alignment (pickup) head 24, which accommodates therein the light source 31 and the detectors 38 and 39, is projected onto a region in a mark setting area 20 of the mask 1 and the wafer 2 in which various patterns are formed. The light beam is modulated by these patterns and emanates from the mask I back to the alignment pickup head 24. At best seen in FIGS. 7 and 8, the alignment pickup head 24 is mounted to the stage 21, so that it can be moved two-dimensionally as desired in accordance with the alignment region. This movement is controlled by a stage controlling means 22. Here, the stage 21 is guided by a super-flat base plate 23, and no pitching or yawing occurs. At start of the alignment or gap controlling operation, the stage controlling means 22 drives the stage 21 to move the head 24 to a predetermined position for illumination of an evaluation mark 20 of the mask and the wafer and for detection of the light from the mask 1, which position is stored beforehand.

Figure 8:
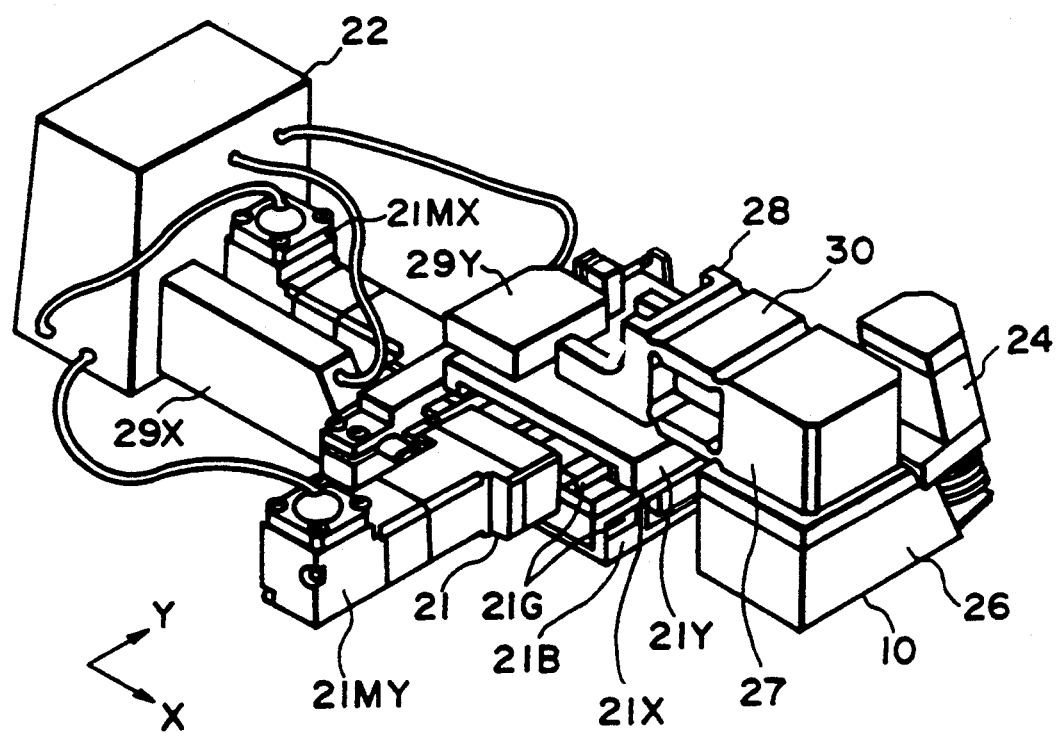
FIG. 8 is a representation for showing the appearance of an alignment head driving mechanism of FIG. 1.

Details of the moving mechanism will be described. As best seen in FIG. 8, the alignment head 24 is mounted to a clamper means 27 which serves to press the super-flat surface 10 of a supporting member 26 against the super-flat base plate 23 with a constant pressing force, and thus the alignment head is placed on the upper portion of the alignment device main assembly with the intervention of the super-flat base plate 23. The clamper means 27 is coupled to a movement supporting portion 28 on the two-dimensionally movable stage 21 through parallel springs 30. The stage 21 comprises a base portion 21B, an X-axis sliding portion 21X, a Y-axis sliding portion 21Y, a guide portion 21G for guiding the X-axis and Y-axis sliding portions, as well as drive sources 21MX and 21MY for driving the sliding portions 21X and 21Y, mounted on the base portion 21B, in the X and Y directions, respectively. The operations of the drive sources MX and MY are so controlled by the controller 22 as to move the head 24 in respective directions to thereby position the head at a desired position.

The amount of movement of the stage is measured by means of a laser distance gauge 29X and/or a laser distance gauge 29Y precisely, and the obtained data is inputted to the controller 22. On the basis of the obtained data, the controller 22 detects the current position of the head 24 and supplies an instruction signal to the drive source MX and/or MY corresponding to the desired position. By this, the position of the head 24 can be controlled precisely. After movement of the head to the detecting position, the lateral deviation detection and the gap detection are carried out through the coarse and fine alignment systems, in sequence, and, on the basis of the results of detection, the wafer stage 25 (FIG. 7) is moved through an unshown driving means by an amount and in a direction correcting the detected lateral deviation and the detected gap error.

The alignment pickup head 24 accommodates therein the coarse and fine alignment systems of the lateral deviation detecting system as well as the coarse and fine alignment systems of the gap detecting system, wherein major portions of the light projecting and light receiving systems are used in common in these alignment systems.

The light projecting and receiving window 35 of the alignment pickup head 24 is equipped with a filter effective to block X-rays from a light source used for the exposure (pattern printing).

Light beam emanating from the light source (semiconductor laser, in this example) 31 travels via a collimator lens 32, a light projecting lens 33 and a reflection mirror 34, and it impinges of an evaluation mark setting area 20. The light beam emanating from the mark setting area 20 is directed by a detection lens 36 to a half mirror 37, by which it is divided into two. The divided light beams then impinge on the light receiving element 38 for the coarse alignment purpose and the light receiving element 39 for the fine alignment purpose. Then, these light beams incident on the light receiving elements 38 and 39 are converted into electric signals for the coarse alignment and fine alignment, respectively, and thereafter, the signals are inputted into the controller and are processed therein.

In the mark setting area 20, on the mask 1 there are provided marks 41M and 42M for detection of lateral deviation and marks 43in, 44in, 43out and 44out for the gap measurement, which are formed in a juxtaposed relation. On the wafer 2, there are formed marks 41W and 42W at positions corresponding to the marks 41M and 42M of the mask. The present embodiment is so designed that on the mark setting area 20 the projected light 47 from the alignment head 24 comprises a parallel light, and it illuminates the marks 41M and 42M simultaneously.

In the coarse and fine alignment systems for the detection of a lateral deviation, the alignment marks 41M and 42M of the mask 1 have a light converging function, respectively. The wafer marks 41W and 42W each has a function for imaging through the lens the point of convergence of the light upon a position which is optically conjugate with the detector 38 (39). By this, the lateral deviation is magnified on the detection surface, and is detected. The light receiving lens 36 constitutes a relay lens system for relaying the point of convergence of light by the wafer mark 41W (42W) to the detector 38 (39) (see FIGS. 3A and 3B).

On the other hand, the projected parallel light 47 illuminates the alignment pattern 43in (for coarse gap adjustment) and the alignment pattern 44in (for fine gap adjustment) of the mask, simultaneously. The light passing through the alignment pattern 43in (44in) and diffracted and deflected thereby is regularly reflected by the wafer 2 surface and then is projected onto a certain region on the alignment pattern 43out (44out) of the mask in accordance with the gap between the mask and the wafer. Then, it emanates from tile mask with an angle corresponding to the gap and it is directed to the detector 38 (39) with a displacement thereon as determined in accordance with equation (2) (see FIGS. 5A and 5B).

In the present embodiment, the lateral deviation detecting system and the gap detecting system may be provided in separate pickup heads. Also, the coarse and fine alignment systems may have a common signal processing system.

Figure 6:
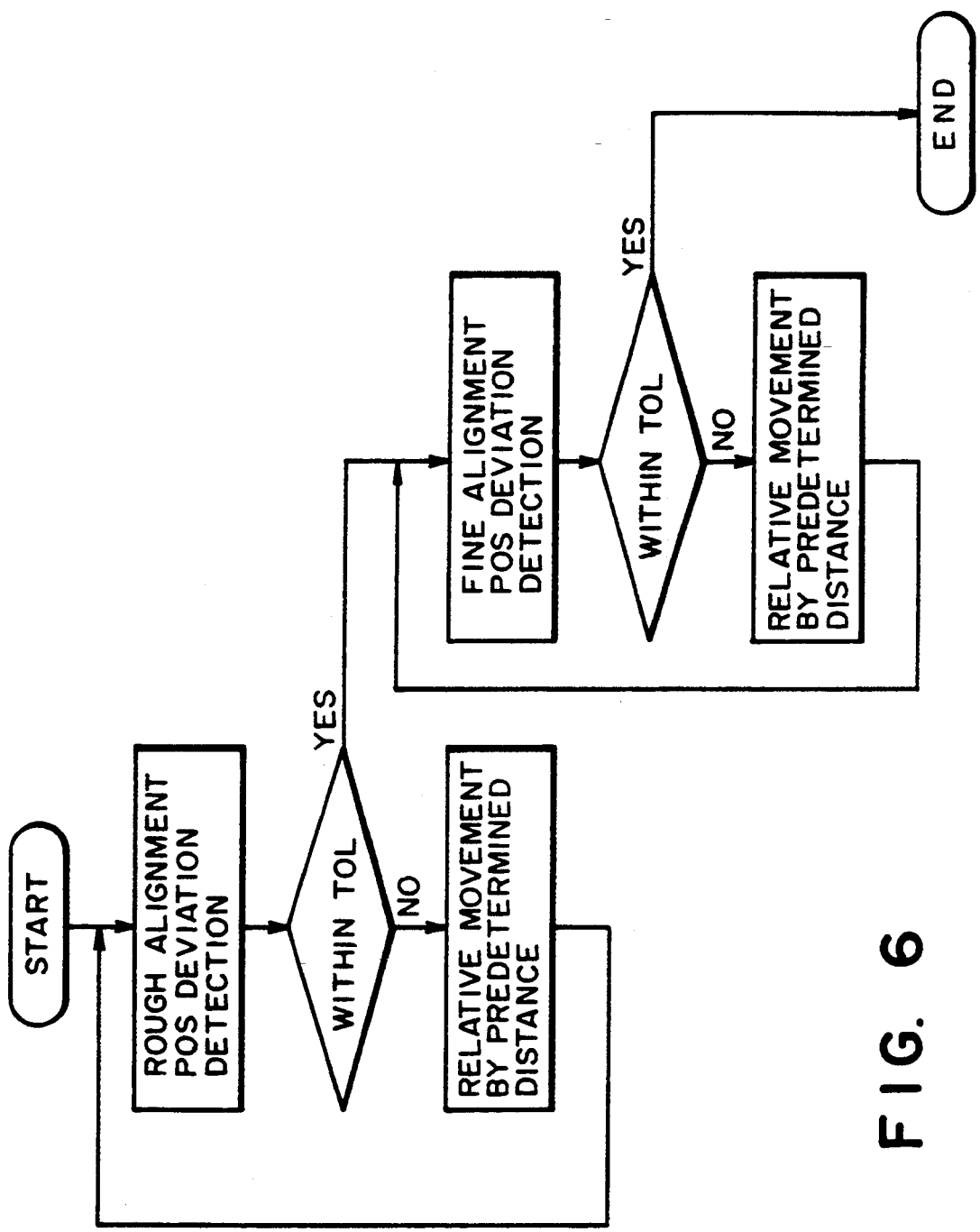
FIG. 6 is a flow chart showing sequential operations for alignment and gap adjustment, in accordance with an embodiment of the present invention.
Figure 7:
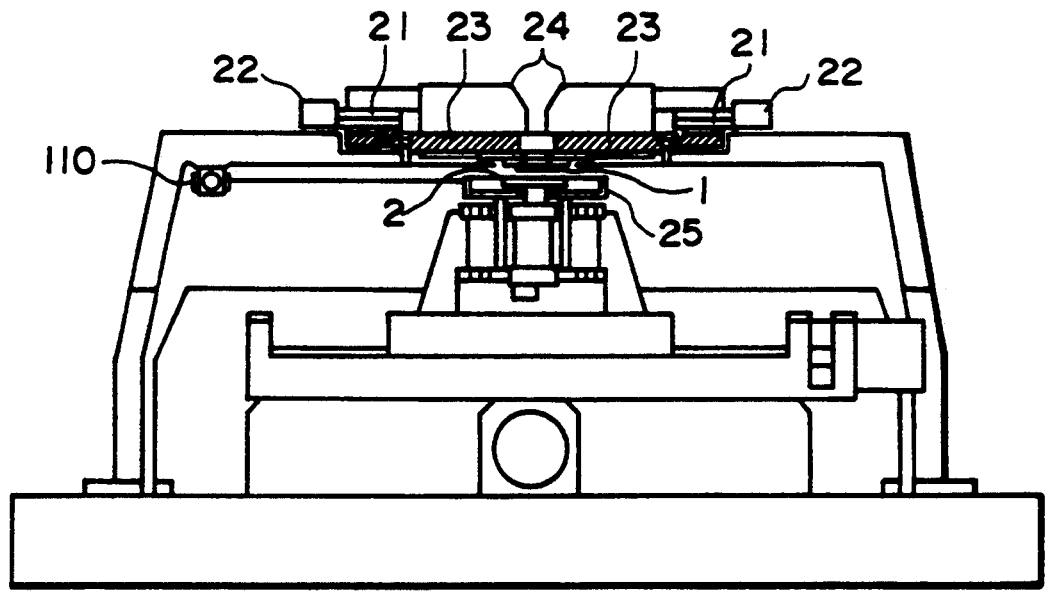
FIG. 7 is a representation for showing the appearance of the exposure apparatus of FIG. 1.

In the gap adjustment of a mask and a wafer as well as the alignment of them may be made in this order each in accordance with the flow shown in the flow chart of FIG. 6.

First, by using the coarse alignment system for the gap detection, the gap between the mask and the wafer is detected. Then the mask-to-wafer gap is adjusted by moving the wafer stage upwardly or downwardly so that the wafer can be positioned within the detection range of the fine alignment system of the gap detecting system. This is the preparative or coarse (relatively coarse) gap adjustment. Then, by using the fine alignment system of the gap detecting system, the relatively roughly adjusted gap of the mask and the wafer is detected and, by moving the wafer stage, the gap is adjusted very precisely to a desired gap. This is the final or fine (relatively fine) gap adjustment.

Subsequently, by using the coarse alignment system of the lateral deviation detecting system, a positional deviation of the mask and the wafer is detected and, by moving the wafer stage 25, the relative position of the mask and the wafer is relatively roughly adjusted so that they are brought into the detection range of the fine alignment system of the lateral deviation detecting system. Then, by using this fine alignment system, any residual positional deviation of the mask and the wafer is detected and, by moving the wafer stage, final or fine (relatively fine) alignment of the mask and the wafer is executed.

After this fine alignment is completed, an X-ray beam is projected to the mask, whereby the wafer is exposed to the mask and whereby the circuit pattern of the mask is printed on the wafer.

Figure 9:
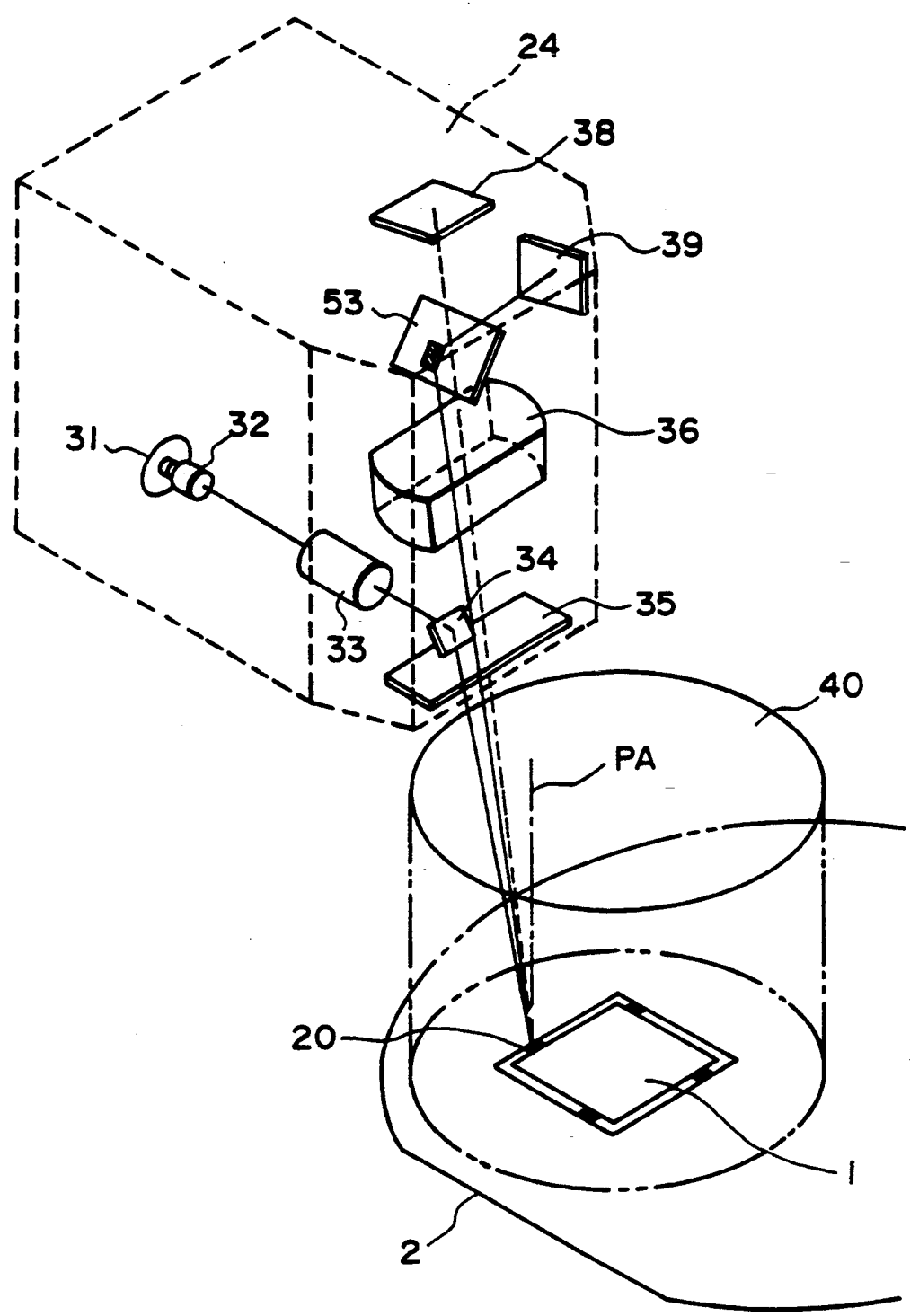
FIG. 9 is a schematic view showing a modified form of the alignment head of FIG. 1.

FIG. 9 shows a major portion of a second embodiment of the present invention. This embodiment differs from the preceding embodiment in that, as a means for dividing light from the lens 36 into those to be received by the detectors 38 and 39 of the coarse and fine alignment systems, respectively, a patterned mirror 53 having a reflection surface formed only in a particular region is used in place of the half mirror 37. The remaining portion is essentially of the same structure as the preceding embodiment.

In this embodiment, between the coarse alignment system and the fine alignment system, there is a small difference in the angle of emission of light from the mask 1 and, thus, the light beams from these alignment systems are spatially separated. Also, only the region through which the light beam of the coarse alignment system passes is formed into a mirror surface 52, and the remaining region is formed into a transmission surface.

Figure 10:
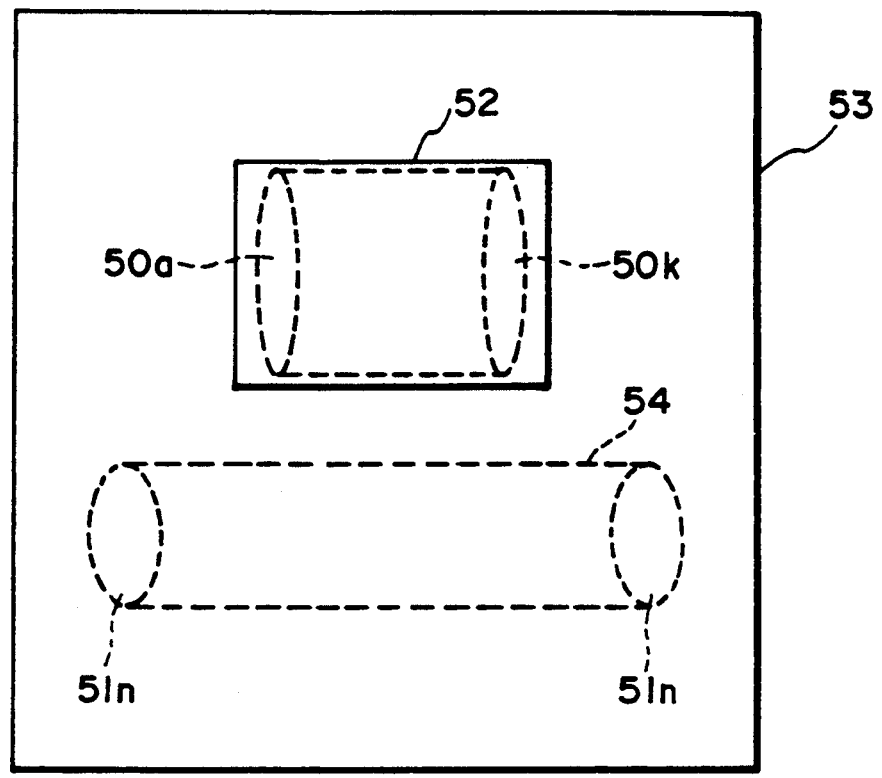
FIG. 10 is a schematic view for explaining a patterned mirror of FIG. 9.

FIG. 10 is a schematic view of the surface of the patterned mirror 53. It is now assumed that when the coarse and fine alignment systems have a difference of about 4° in the angle of incidence of light upon the lens 36 and when upon the patterned mirror 53 surface the light beams of these alignment systems are incident on separate regions, the movable region of the light beam of the coarse alignment system in the practical range are depicted by regions 50a–50n, corresponding to respective dynamic ranges, while those of the light beam of the fine alignment system are depicted by regions 51a–51k. Here, the regions 50a–50n correspond to the region 54 depicted by a broken line in FIG. 10. In this drawing, the region 52 which includes the movable regions 51a–51k of the light beam of the fine alignment system in the practical range but which does not include the movable regions 50a–50n of the light beam of the coarse alignment system, is formed into a mirror surface.

It is to be noted here that substantially the same advantageous effects are attainable by providing a mirror surface only on the region 54 through which the light beam of the coarse alignment system goes, such that the light beams of the coarse and fine alignment systems are separated from each other.

Figure 11:
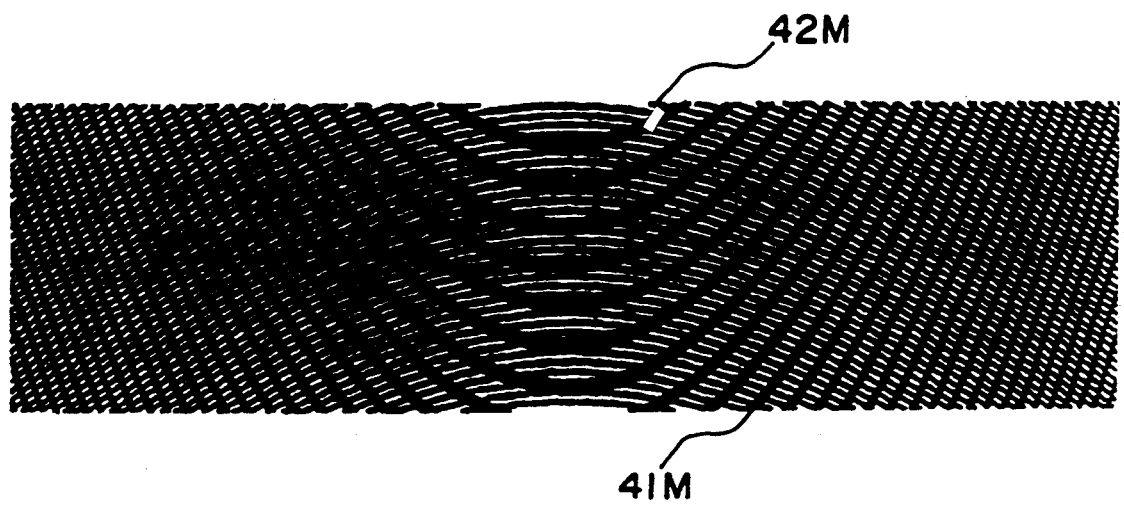
FIG. 11 is an enlarged view, showing a modified form of mask mark for the coarse and fine alignment.

As an alternative, by changing the angle of signal emission of the coarse and fine alignment systems in the longitudinal direction of the sensor, different regions of a common sensor may be used as a sensor for detection of displacement of the light beam in the coarse and fine alignment system. Further, the detection through the coarse alignment system and that through the fine alignment system may be made sequentially such that the same region of a sensor may be used. As a further alternative, the alignment mark (zone plate) of the mask or wafer for the lateral deviation detection may comprise such as shown in FIG. 11 wherein a coarse alignment pattern and a fine alignment pattern are formed superposedly on the same region.

Figure 12A:
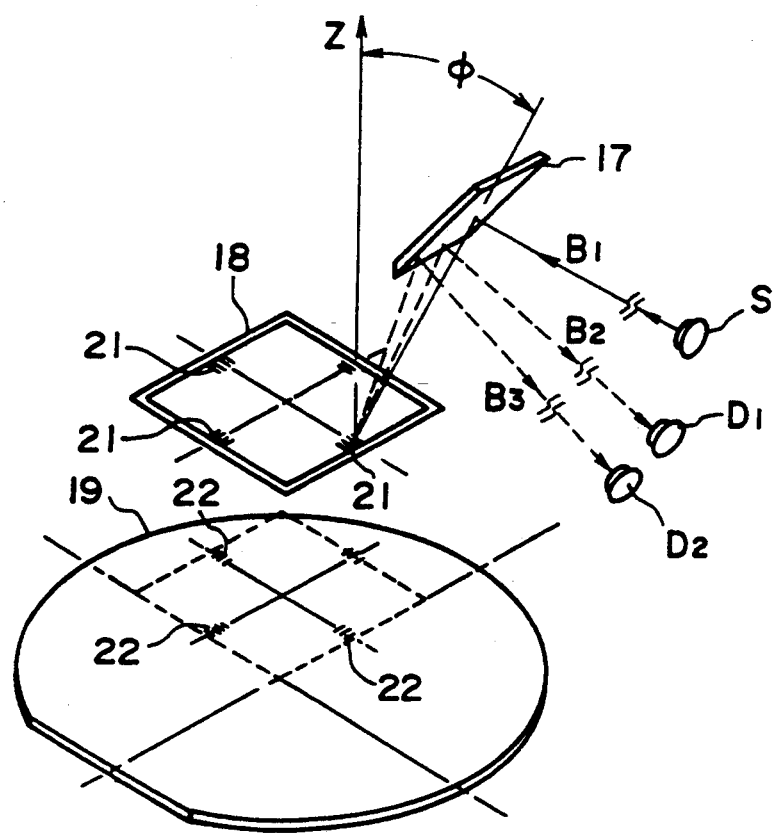
FIG. 12A is a schematic view of an X-ray exposure apparatus, for explaining another embodiment of the present invention.
Figure 12B:
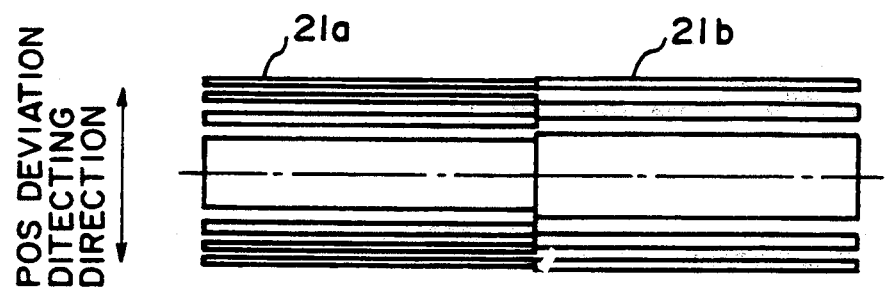
FIG. 12B is an enlarged schematic view of marks of a mask and a wafer for relatively coarse and fine alignment.
Figure 12C:
FIG. 12C is a schematic view for explaining a liner beam on the wafer, for relatively coarse and fine alignment.

FIG. 12A shows a further embodiment of the present invention which is applied to an X-ray exposure apparatus. This embodiment differs from the preceding embodiment in the point of alignment system. FIG. 12B shows mask and wafer marks of FIG. 12A, wherein the mask 18 has formed thereon linear zone plates (alignment marks) 121a and 121b while the wafer 19 has formed thereon rectangular pattern arrays (alignment marks) 122a and 122b, arrayed along a straight line at a regular pitch. The direction in which the linear zone plate 121a (121b) has a light converging function (power) corresponds to the alignment direction. Light beam B1 projected from a light source S travels via a mirror 17 and is projected on the zone plate 121a (121b) within a plane containing a normal Z to the center of that mark and perpendicular to the positional deviation detecting direction, at a certain angle $\Phi$ with respect to the normal (Z-axis). By the zone plate 121a (121b), the light beam is converged on the wafer in a linear shape such as shown in FIG. 12C. Then, the light beam is diffracted by the pattern 121a (121b) of the wafer and emanates as a signal light B2 (B3) of a predetermined order or orders, with a certain angle as determined by the pitch of the wafer pattern. The emanating light beam travels via the mirror 17 and impinges on a detector D1 (D2). In FIG. 12C, denoted at 1a is the beam of linear shape as formed by the zone plate 121a, denoted at 1b is the beam of linear shape as formed by the zone plate pattern 121b. By moving the wafer 19 in the positional deviation detecting direction, the pattern arrays 122a and 122b are scanned with corresponding linear beams 1a and 1b, respectively.

In this embodiment, the zone plate 121b and the pattern array 122b are used in a pair for the relatively coarse alignment, whereas the zone plate 121a and the pattern array 122a are used in a pair for the relatively fine alignment.

The spacing between the mask 18 and the wafer 19 is illustrated in the drawing in an enlarged scale, and actually the mask and the wafer are disposed close to each other with a spacing not larger then 100 microns. If there occurs a positional deviation in the alignment direction between the mask and the wafer, there occurs a change in quantity of diffraction light, diffracted by the wafer pattern 122a (122b) and, as a result, the quantity of diffraction light received by the detector D1 (D2) changes.

Figure 13A:
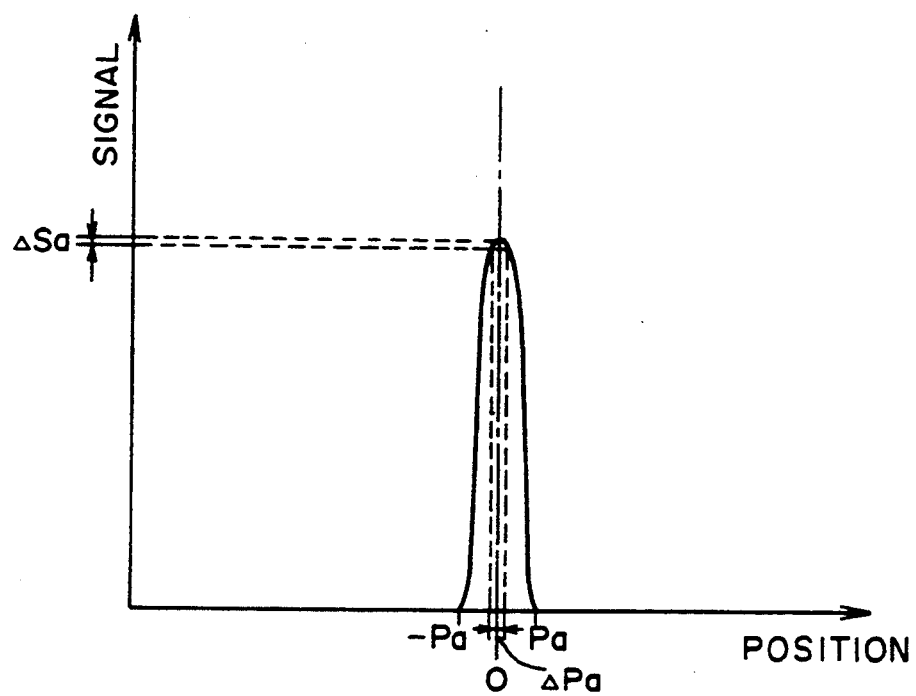
FIGS. 13A and 13B are graphs, respectively, for explaining a signal obtainable from a diffraction beam produced by a wafer mark for relatively fine alignment and a signal obtainable from a diffraction beam produced by a wafer mark for relatively coarse alignment.
Figure 13B:
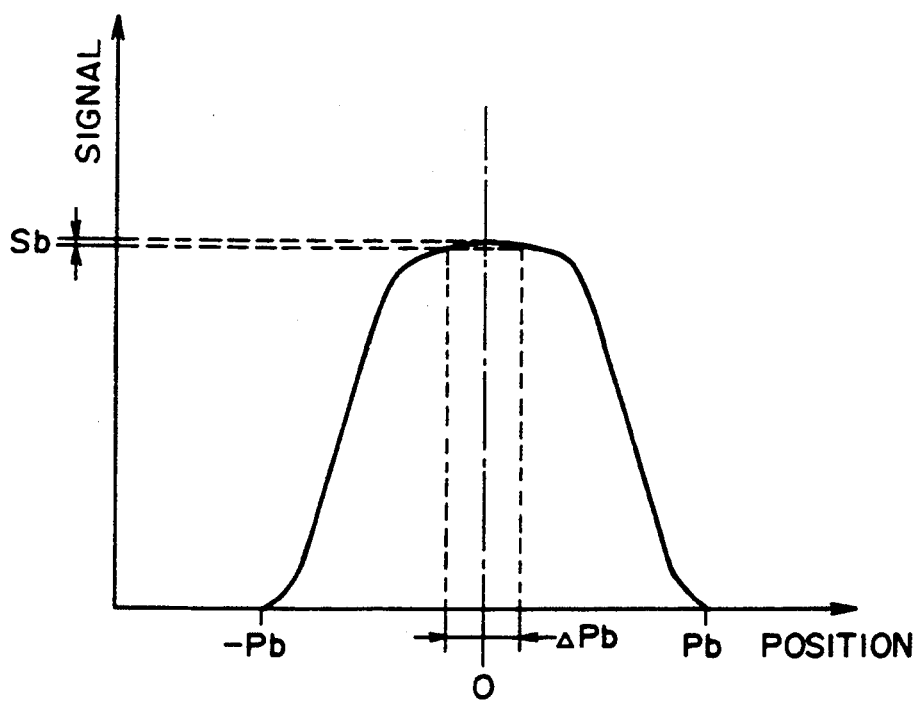

FIGS. 13A and 13B each show the relationship between (i) the positional deviation of the mask and the wafer in the alignment direction and (ii) the light quantity signal of the detector D1 (D2) representing the quantity of received diffraction light. FIG. 13A shows the output signal of the detector D1 which receives the signal light B2 diffracted by the alignment marks 121a and 122a, while FIG. 13B shows the output signal of the detector D2 which receives the signal light B3 diffracted by the alignment marks 121b and 122b.

The signal from the detector D1 reaches its maximum level when the center of the linear beam 1a on the wafer 19 surface is aligned with the center of the rectangular pattern array 122a as the mask and the wafer are aligned correctly. If, as one that represents the maximum level, the width of the detected signal influenced by a noise component is considered and it is denoted by $\Delta Sa$, then the positional deviation error corresponding to that width can be represented by $\Delta Pa$ as depicted in the drawing.

On the other hand, the output signal of the detector D2 reaches its maximum level when the center of the linear beam 1b on the wafer 19 surface is aligned with the center of the rectangular pattern array 122b as the mask and the wafer are correctly aligned. Similarly, by taking the width ΔSb of the detected maximum level signal, the positional deviation error corresponding to that width can be represented by ΔPb as depicted in the drawing.

In FIGS. 13A and 13B, the detection ranges are −Pa to Pa, and −Pb to Pa, respectively. Thus, the detection range is wider In the signal from the detector D2 (FIG. 13B) than in that from the detector D1.

The signal detection range is determined by the width of the linear beam 1a (1b) on the wafer 19 surface and the width of the rectangular pattern array 122a (122b), both in the alignment direction. Accordingly, by making smaller the width of the linear beam and the size of the rectangular pattern, it is possible to reduce the positional deviation error, as in the case of the signal from the detector D1. Thus, higher precision alignment is attainable, but the detection range becomes narrower. To the contrary, by making larger at least one of the width of the linear beam and the size of the rectangular pattern, the detection range becomes wider although the positional deviation error becomes larger, as in the case of the signal from the detector D2.

In this embodiment, a coarse alignment system and a fine alignment system having different precisions and different detection ranges are used in combination, to thereby ensure an alignment system of high precision and wide detection range.

The alignment operation in this embodiment may be made in the following sequence: First, the wafer 19 is moved in the alignment direction so that the signal from the detector D2 of the coarse alignment system reaches it maximum level. When this is accomplished, while the signal from the detector D2 contains a positional deviation error ΔPa, the wafer 19 can be positioned within the detection range of the fine alignment system. Then, the wafer 19 is moved again so that the signal from the detector of the fine alignment system reaches its maximum level. By this, fine or final alignment of the wafer is accomplished.

In the present embodiment, for speed-up of the alignment operation, the gap between the mask and the wafer is maintained constant throughout the period of coarse and fine alignment operation. Namely, the mask-to-wafer gap is set to be equal to the focal length of the linear zone plate 121a of the fine alignment system. Thus, the linear beam 1b formed by the zone plate 121b of the coarse alignment system is slightly defocused on the wafer 19 surface while the linear beam 1a formed by the zone plate 121a of the fine alignment system is correctly focused on the wafer 19 surface.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a wafer to a circuit pattern of a mask, wherein the mask has formed thereon first and second patterns each having an optical power, wherein the wafer has formed thereon first and second marks each having an optical power, wherein the first pattern and the first mark are cooperable with each other to produce, in response to being irradiated by a radiation beam, a first beam which is displaceable at a first magnification with a positional deviation of the wafer with respect to the mask, and wherein the second pattern and the second mark are cooperable with each other to produce, in response to being irradiated by a radiation beam, a second beam which is displaceable at a second magnification, larger than the first magnification, with a positional deviation of the wafer with respect to the mask, said apparatus comprising:

means for moving the wafer;

an optical head including (i) irradiating means for projecting a radiation beam to the mask and (ii) light receiving means having first and second sensors for receiving the first and second beams, respectively, to produce first and second signals, respectively, corresponding to positions of incidence of the received first and second beams, respectively; and control means for receiving the first and second signals from said first and second sensors, respectively, said control means being effective to control said moving means in response to the first signal to relatively roughly align the wafer with the mask and being effective to control said moving means in response to the second signal to relatively finely align the relatively roughly aligned wafer with the mask.

2. An apparatus according to claim 1, wherein each of the first and second patterns and the first and second marks comprises a zone plate pattern.

3. An apparatus according to claim 2, wherein the first and second patterns are overlapping.

4. A method of aligning a mask and a wafer, comprising:

a step for providing the mask with first and second patterns each having an optical power and providing the wafer with first and second marks each having an optical power, wherein the first pattern and the first mark are cooperable with each other to produce, in response to being irradiated with a radiation beam, a first beam which is displaceable at a first magnification with a positional deviation of the wafer with respect to the mask, and wherein the second pattern and the second mark are cooperable with each other to produce, in response to being irradiated by a radiation beam, a second beam which is displaceable at a second magnification, larger than the first magnification, with a positional deviation of the wafer with respect to the mask;

a first detecting step for projecting a radiation beam to the mask, whereby the first beam is produced through cooperation of the first pattern and the first mark, and for detecting a positional deviation of the wafer with respect to the mask on the basis of the first beam;

a first aligning step for preparatively aligning the wafer with the mask in accordance with the detection by said first detecting step;

a second detecting step for projecting, after said first aligning step, a radiation beam to the mask whereby the second beam is produced through cooperation of the second pattern and the second mark, and for detecting a residual positional deviation of the wafer with respect to the mask on the basis of the second beam; and a second aligning step for precisely aligning the wafer with the mask in accordance with the detection by said second detecting step.

5. An apparatus according to claim 4, wherein each of the first and second patterns and the first and second marks comprises a zone plate pattern.

6. An apparatus according to claim 5, wherein the first and second patterns are overlapping.

7. In a semiconductor device manufacturing method usable with a mask having a circuit pattern and a wafer to be aligned with the mask and to be exposed to the circuit pattern of the mask for manufacture of semiconductor devices, the method comprising:

a step for providing the mask with first and second patterns each having an optical power and providing the wafer with first and second marks each having an optical power, wherein the first pattern and the first mark are cooperable with each other to produce, in response to being irradiated by a radiation beam, a first beam which is displaceable at a first magnification with a positional deviation of the wafer with respect to the mask, and wherein the second pattern and the second mark are cooperable with each other to produce, in response to being irradiated by a radiation beam, a second beam which is displaceable at a second magnification, larger than the first magnification, with a positional deviation of the wafer with respect to the mask;

a first detecting step for projecting a radiation beam to the mask, whereby the first beam is produced through cooperation of the first pattern and the first mark, and for detecting a positional deviation of the wafer with respect to the mask on the basis of the first beam;

a first aligning step for preparatively aligning the wafer with the mask in accordance with the detection by said first detecting step;

a second detecting step for projecting, after said first aligning step, a radiation beam to the mask whereby the second beam is produced through cooperation of the second pattern and the second mark, and for detecting a residual positional deviation of the wafer with respect to the mask on the basis of the second beam;

a second aligning step for precisely aligning the wafer with the mask in accordance with the detection by said second detecting step; and a direction step for directing, after said second alignment step, radiation energy to the circuit pattern of the mask and the wafer.

8. An apparatus according to claim 7, wherein each of the first and second patterns and the first and second marks comprises a zone plate pattern.

9. An apparatus according to claim 8, wherein the first and second patterns are overlapping.

10. An exposure apparatus for exposing a wafer to a circuit pattern of a mask, wherein the mask has formed thereon a first pair of first grating pattern and first deflection pattern having an optical power, and a second pair of second grating pattern and second deflection pattern having an optical power, wherein the first pair patterns are such that a radiation beam is diffracted by the first grating pattern and, after the radiation beam is reflected by a surface of the wafer, it is passed through the first deflection pattern whereby a first beam is produced which first beam is displaceable at a first magnification with an error of a gap between the mask and the wafer, and wherein the second pair patterns are such that a radiation beam is diffracted by the second grating pattern and, after the radiation beam is reflected by the surface of the wafer, it is passed through the second deflection pattern whereby a second beam is produced which second beam is displaceable at a second magnification, larger than the first magnification, with an error in the gap between the mask and the wafer, said apparatus comprising:

means for moving the wafer;

an optical head including (i) irradiating means for projecting a radiation beam to the mask and (ii) light receiving means having first and second sensors for receiving the first and second beams from the mask, respectively, to produce first and second signals, respectively, corresponding to positions of incidence of the received first and second beams, respectively; and control means for receiving the first and second signals from said first and second sensors, respectively, said control means being effective to control said moving means in response to the first signal to relatively roughly adjust the gap between the mask and the wafer and being effective to control said moving means in response to the second signal to relatively finely adjust the gap between the mask and the wafer.

11. An apparatus according to claim 10, wherein each of the first and second deflection patterns comprises a zone plate pattern.

12. A method of adjusting a gap between a mask and a wafer disposed opposed to each other, comprising:

a providing step for providing the mask with a first pair of first grating pattern and first deflection pattern having an optical power, and a second pair of second grating pattern and second deflection pattern having an optical power, wherein the first pair patterns serve are such that a radiation beam is diffracted by the first grating pattern and, after the radiation beam is reflected by a surface of the wafer, it is passed through the first deflection pattern whereby a first beam is produced which first beam is displaceable at a first magnification with an error of a gap between the mask and the wafer, and wherein the second pair patterns serve are such that a radiation beam is diffracted by the second grating pattern and, after the radiation beam is reflected by the surface of the wafer, it is passed through the second deflection pattern whereby a second beam is produced which second beam is displaceable at a second magnification, larger than the first magnification, with an error in the gap between the mask and the wafer;

a first detecting step for irradiating the mask with a radiation beam and for detecting an error in the gap between the mask and the wafer by using the first beam produced by the first pair patterns;

a first adjusting step for adjusting the gap between the mask and the wafer in accordance with the detection at said first detecting step;

a second detecting step for irradiating, after said first adjusting step, the mask with a radiation beam and for detecting an error in the gap between the mask and the wafer by using the second beam produced by the second pair patterns; and a second adjusting step for adjusting the gap between the mask and the wafer with a higher precision.

13. A method according to claim 12, wherein each of the first and second deflection patterns comprises a zone plate pattern.

14. In a semiconductor device manufacturing method usable with a mask having a circuit pattern and a wafer disposed to be opposed to the mask with a gap, wherein, after adjustment of the gap between the mask and the wafer, the wafer is exposed to the circuit pattern of the mask for manufacture of semiconductor devices, the method comprising:

a providing step for providing the mask with a first pair of a first grating pattern and a first deflection pattern having an optical power, and a second pair of a second grating pattern and a second deflection pattern having an optical power, wherein the first pair patterns are such that a radiation beam is diffracted by the first grating pattern and, after the radiation beam is reflected by a surface of the wafer, it is passed through the first deflection pattern whereby a first beam is produced which first beam is displaceable at a first magnification with an error of a gap between the mask and the wafer, and wherein the second pair patterns are such that a radiation beam is diffracted by the second grating pattern and, after the radiation beam is reflected by the surface of the wafer, it is passed through the second deflection pattern whereby a second beam is produced which second beam is displaceable at a second magnification, larger than the first magnification, with an error in the gap between the mask and the wafer;

a first detecting step for irradiating the mask with a radiation beam and for detecting an error in the gap between the mask and the wafer by using the first beam produced by the first pair of patterns;

a first adjusting step for adjusting the gap between the mask and the wafer in accordance with the detection at said first detecting step;

a second detecting step for irradiation, after said first adjusting step, the mask with a radiation beam and for detecting an error in the gap between the mask and the wafer by using the second beam produced by the second pair of patterns;

a second adjusting step for adjusting the gap between the mask and the wafer with a higher precision; and a directing step for directing, after said second adjusting step, radiation energy to the circuit pattern of the mask and to the wafer for exposure of the wafer.

15. A method according to claim 14, wherein each of the first and second deflection patterns comprises a zone plate pattern.

16. A method of aligning a mask and a wafer, comprising:

a providing step for providing the mask with a first pattern having an optical power and a second pattern having an optical power larger than that of the first pattern, and for providing the wafer with a first grating mark including first mark elements arrayed in a predetermined direction and second grating mark including second mark elements arrayed in the predetermined direction, wherein the first grating mark serves to produce, in response to being irradiated by a radiation beam converged by the first pattern of the mask, a first diffraction beam having an intensity which is changeable with a positional deviation of the wafer with respect to the mask, and wherein the second grating mark serves to produce, in response to being irradiated by a radiation beam converged by the second pattern of the mask, a second diffraction beam having an intensity which is changeable, largely as compared with the first diffraction beam, with a positional deviation of the wafer with respect to the mask;

a first detecting step for projecting a radiation beam to the mask opposed to the wafer with a predetermined gap, and for detecting a positional deviation of the wafer with respect to the mask by using the first beam produced by the first grating mark;

a first aligning step for aligning the wafer with respect to the mask in accordance with the positional deviation detected in said first detecting step;

a second detecting step for projecting, after said first aligning step, a radiation beam to the mask opposed to the wafer with the predetermined gap, and for detecting a residual positional deviation of the wafer with respect to the mask by using the second beam produced by the second grating mark; and a second aligning step for relatively finely aligning the wafer with respect to the mask in accordance with the detection by said second detecting step.

17. A method according to claim 16, wherein each of the first and second patterns comprises a zone plate pattern effective to converge a received radiation beam to project, on the wafer, a beam of linear shape extending in the predetermined direction.

18. A method according to claim 16, wherein the radiation beam comprises a substantially parallel beam and wherein the predetermined gap is set to be substantially equal to a focal length of the second pattern.

19. A method according to claim 16, wherein the first and second grating marks are provided by a common grating mark.

20. In a semiconductor device manufacturing method usable with a mask and a wafer, wherein the mask and the wafer are aligned with each other and wherein, after the alignment, the wafer is exposed to a circuit pattern of the mask for manufacture of semiconductor devices, the method comprising:

a providing step for providing the mask with a first pattern having an optical power and a second pattern having an optical power larger than that of the first pattern, and for providing the wafer with a first grating mark including first mark elements arrayed in a predetermined direction and a second grating mark including second mark elements arrayed in the predetermined direction, wherein the first grating mark serves to produce, in response to being irradiated by a radiation beam converged by the first pattern of the mask, a first diffraction beam having an intensity which is changeable with a positional deviation of the wafer with respect to the mask, and wherein the second grating mark serves to produce, in response to being irradiated by a radiation beam converged by the second pattern of the mask, a second diffraction beam having an intensity which is changeable, largely as compared with the first diffraction beam, with a positional deviation of the wafer with respect to the mask;

a first detecting step for projecting a radiation beam to the mask opposed to the wafer with a predetermined gap, and for detecting a positional deviation of the wafer with respect to the mask by using the first beam produced by the first grating mark;

a first aligning step for aligning the wafer with respect to the mask in accordance with the positional deviation detected in said first detecting step;

a second detecting step for projecting, after said first aligning step, a radiation beam to the mask opposed to the wafer with the predetermined gap, and for detecting a residual positional deviation of the wafer with respect to the mask by using the second beam produced by the second grating mark;

a second aligning step for relatively finely aligning the wafer with respect to the mask in accordance with the detection by said second detecting step; and a directing step for directing radiation energy to the circuit pattern of the mask and the wafer, for exposure of the wafer.

21. A method according to claim 20, wherein each of the first and second patterns comprises a zone plate pattern effective to converge a received radiation beam to project, on the wafer, a beam of linear shape extending in the predetermined direction.

22. A method according to claim 20, wherein the radiation beam comprises a substantially parallel beam and wherein the predetermined gap is set to be substantially equal to a focal length of the second pattern.

23. A method according to claim 20, wherein the first and second grating marks are provided by a common grating mark.

24. A semiconductor device produced by a semiconductor device manufacturing method usable with a mask having a circuit pattern and a wafer to be aligned with the mask and to be exposed to the circuit pattern of the mask for manufacture of semiconductor devices, the method comprising:

a step for providing the mask with first and second patterns each having an optical power and providing the wafer with first and second marks each having an optical power, wherein the first pattern and the first mark are cooperable with each other to produce, in response to being irradiated by a radiation beam, a first beam which is displaceable at a first magnification with a positional deviation of the wafer with respect to the mask, and wherein the second pattern and the second mark are cooperable with each other to produce, in response to being irradiated by a radiation beam, a second beam which is displaceable at a second magnification, larger than the first magnification, with a positional deviation of the wafer with respect to the mask;

a first detecting step for projecting a radiation beam to the mask, whereby the first beam is produced through cooperation of the first pattern and the first mark, and for detecting a positional deviation of the wafer with respect to the mask on the basis of the first beam;

a first aligning step for preparatively aligning the wafer with the mask in accordance with the detection by said first detecting step;

a second detecting step for projecting, after said first aligning step, a radiation beam to the mask whereby the second beam is produced through cooperation of the second pattern and the second mark, and for detecting a residual positional deviation of the wafer with respect to the mask on the basis of the second beam;

a second aligning step for precisely aligning the wafer with the mask in accordance with the detection by said second detecting step; and a direction step for directing, after said second alignment step, radiation energy to the circuit pattern of the mask and the wafer.

25. A semiconductor device produced by a semiconductor device manufacturing method usable with a mask having a circuit pattern and a wafer disposed to be opposed to the mask with a gap, wherein, after adjustment of the gap between the mask and the wafer, the wafer is exposed to the circuit pattern of the mask for manufacture of semiconductor devices, the method comprising:

a providing step for providing the mask with a first pair of a first grating pattern and a first deflection pattern having an optical power, and a second pair of a second grating pattern and a second deflection pattern having an optical power, wherein the first pair patterns are such that a radiation beam is diffracted by the first grating pattern and, after the radiation beam is reflected by a surface of the wafer, it is passed through the first deflection pattern whereby a first beam is produced which first beam is displaceable at a first magnification with an error of a gap between the mask and the wafer, and wherein the second pair patterns are such that a radiation beam is diffracted by the second grating pattern and, after the radiation beam is reflected by the surface of the wafer, it is passed through the second deflection pattern whereby a second beam is produced which second beam is displaceable at a second magnification, larger than the first magnification, with an error in the gap between the mask and the wafer;

a first detecting step for irradiating the mask with a radiation beam and for detecting an error in the gap between the mask and the wafer by using the first beam produced by the first pair of patterns;

a first adjusting step for adjusting the gap between the mask and the wafer in accordance with the detection at said first detecting step;

a second detecting step for irradiation, after said first adjusting step, the mask with a radiation beam and for detecting an error in the gap between the mask and the wafer by using the second beam produced by the second pair of patterns;

a second adjusting step for adjusting the gap between the mask and the wafer with a higher precision; and a directing step for directing, after said second adjusting step, radiation energy to the circuit pattern of the mask and to the wafer for exposure of the wafer.

26. A semiconductor device produced by a semiconductor device manufacturing method usable with a mask and a wafer, wherein the mask and the wafer are aligned with each other and wherein, after the alignment, the wafer is exposed to a circuit pattern of the mask for manufacture of semiconductor devices, the method comprising:

a providing step for providing the mask with a first pattern having an optical power and a second pattern having an optical power larger than that of the first pattern, and for providing the wafer with a first grating mark including first mark elements arrayed in a predetermined direction and a second grating mark including second mark elements arrayed in the predetermined direction, wherein the first grating mark serves to produce, in response to being irradiated by a radiation beam converged by the first pattern of the mask, a first diffraction beam having an intensity which is changeable with a positional deviation of the wafer with respect to the mask, and wherein the second grating mark serves to produce, in response to being irradiated by a radiation beam converged by the second pattern of the mask, a second diffraction beam having an intensity which is changeable, largely as compared with the first diffraction beam, with a positional deviation of the wafer with respect to the mask;

a first detecting step for projecting a radiation beam to the mask opposed to the wafer with a predetermined gap, and for detecting a positional deviation of the wafer with respect to the mask by using the first beam produced by the first grating mark;

a first aligning step for aligning the wafer with respect to the mask in accordance with the positional deviation detected in said first detecting step;

a second detecting step for projecting, after said first aligning step, a radiation beam to the mask opposed to the wafer with the predetermined gap, and for detecting a residual positional deviation of the wafer with respect to the mask by using the second beam produced by the second grating mark;

a second aligning step for relatively finely aligning the wafer with respect to the mask in accordance with the detection by said second detecting step; and a directing step for directing radiation energy to the circuit pattern of the mask and the wafer, for exposure of the wafer.

* * * * *

UNITED STATES PATENT AND TRADEMARK OFFICE
CERTIFICATE OF CORRECTION

PATENT NO. : 5,377,009
DATED : December 27, 1994
INVENTOR(S) : KITAOKA, ET AL.

It is certified that error appears in the above-indentified patent and that said Letters Patent is hereby corrected as shown below:

ON THE COVER PAGE

[30] Foreign Application Priority Data

"Jan. 11, 1991 [JP] Japan ..........013715
Jan. 9, 1992 [JP] Japan ...........020514"
should read
--Jan. 11, 1991 [JP] Japan...........3-13715
Jan. 9, 1992 [JP] Japan ...........4-20514--.

[56] References cited

OTHER PUBLICATIONS

"No. 60-216,548." should read
--No. 60-216548--.

IN THE DRAWINGS

Sheet 10 of 11

Figs. 12B and 12C

"DITECTING" should read --DETECTING--.

COLUMN 6

Line 39, "measures" should read --measured--.
Line 56, "produces" should read --products--.
Line 67, "or" should read --a--.

COLUMN 7

Line 48, "The" should read --the--.

UNITED STATES PATENT AND TRADEMARK OFFICE
CERTIFICATE OF CORRECTION

PATENT NO. : 5,377,009

DATED : December 27, 1994

INVENTOR(S) : KITAOKA, ET AL.

It is certified that error appears in the above-indentified patent and that said Letters Patent is hereby corrected as shown below:

COLUMN 10

Line 37, "tile" should read --the--.

COLUMN 11

Line 37, "are" should read --is--.

COLUMN 16

Line 45, "serve" should be deleted.

Signed and Sealed this

Ninth Day of May, 1995

Attest:

BRUCE LEHMAN

Attesting Officer

Commissioner of Patents and Trademarks